(12) United States Patent
Vittal et al.

(10) Patent No.: US 6,980,029 B1
(45) Date of Patent: Dec. 27, 2005

(54) PROGRAMMABLE INTEGRATED CIRCUIT ARCHITECTURE

(75) Inventors: Ashok Vittal, Fremont, CA (US); Hare K. Verma, San Jose, CA (US)

(73) Assignee: Velogix, Inc., Santa Clara, CA (US)

( * ) Notice: Subject to any disclaimer, the term of this patent is extended or adjusted under 35 U.S.C. 154(b) by 68 days.

(21) Appl. No.: 10/319,720

(22) Filed: Dec. 13, 2002

(51) Int. Cl.[7] .......................................... H03K 19/177
(52) U.S. Cl. .......................................... 326/41; 326/38
(58) Field of Search ........................ 326/37–38, 40–41, 326/47, 101

(56) References Cited

U.S. PATENT DOCUMENTS

| | | | |
|---|---|---|---|
| 6,320,411 B1 * | 11/2001 | Mendel | 326/41 |
| 6,335,634 B1 * | 1/2002 | Reddy et al. | 326/41 |
| 6,720,796 B1 * | 4/2004 | Reddy et al. | 326/39 |

* cited by examiner

*Primary Examiner*—James H. Cho
(74) *Attorney, Agent, or Firm*—Haynes Beffel & Wolfeld LLP

(57) ABSTRACT

A programmable logic device has a plurality of levels of programmable logic modules with fixed interconnections. The outputs of a level connect to inputs of the next level of programmable logic modules. The first level is fed from a bank of memory elements and the inputs to this bank of memory elements are derived from the last level. Crossbar switches are optionally inserted between a carefully chosen pairs of levels.

6 Claims, 3 Drawing Sheets

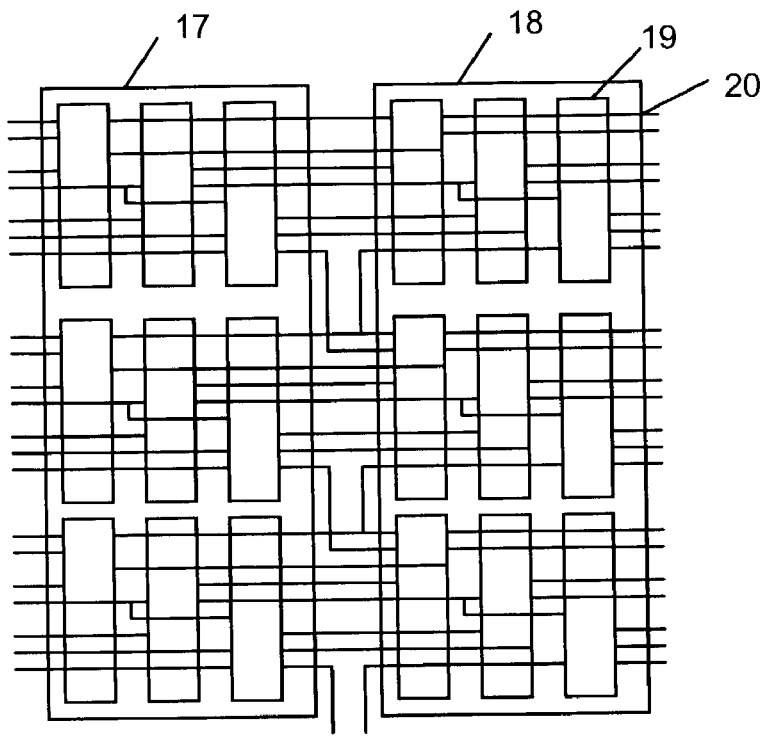
Figure 3 Connections between adjacent levels
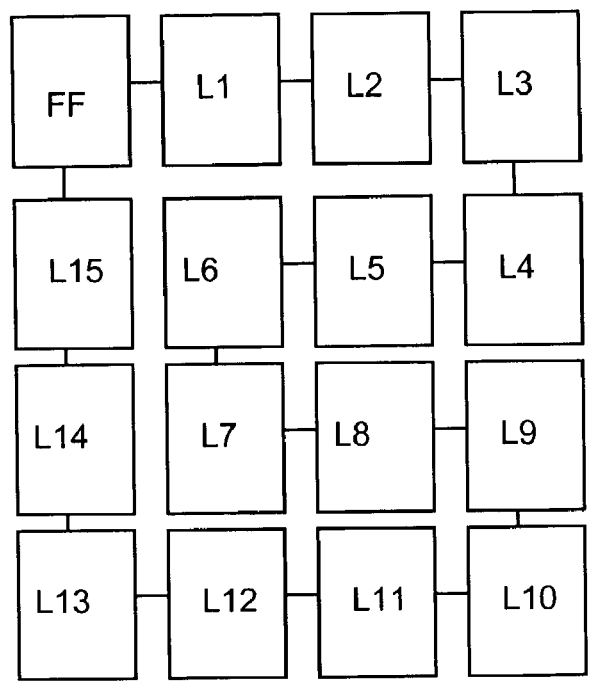
Figure 4. An embodiment of a 15-level programmable integrated circuit

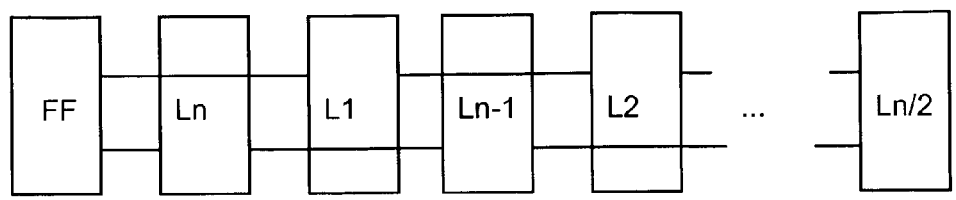
Figure 5. Programmable integrated circuit with interleaved interconnects

PROGRAMMABLE INTEGRATED CIRCUIT ARCHITECTURE

BACKGROUND

1. Field of Invention

This invention relates to programmable integrated circuits, particular to a new architecture that bridges this performance gap, while retaining the flexibility that programmability offers.

2. Description of Related Art

Conventional field programmable gate arrays enable user programming, but are slow due to the delays through the transistors or switches or multiplexers used to program the interconnect between configurable logic elements. Each logic element can be connected to a multitude of other logic elements through switches. Thus, the path from a logic element to the next computing logic element may be strewn with many switches, which slows down circuit operation. Also, some paths in a conventional programmable integrated circuit turn out to be critical and not others, which directly means that a customized circuit which speeds up this path at the expense of other non-critical paths becomes possible, demonstrating the existence of customized implementations that operate faster. Programmable integrated circuits are typically much less dense than custom implementations due to the use of routing channels explicitly for making longer connections, and due to the use of routing matrices, which take up significant area.

SUMMARY OF THE INVENTION

The invention has a plurality of logic levels, connected by fixed interconnect. As there is no delay due to the programming switches, the circuit works faster than conventional programmable integrated circuits. The fixed interconnect is between only adjacent levels and is therefore easy to realize. The absence of switches between levels also makes the circuits denser, and the loads that need to be driven smaller, again enabling faster operation with smaller power dissipation. Each level includes elements which are either sequential (memory elements) or purely combinational—this leads to better layout density compared to conventional architectures where each element contains both sequential and combinational elements.

BRIEF DESCRIPTION OF THE DRAWINGS

FIG. 3 is a diagram of the interconnections between two successive levels, where the actual layout of logic elements and interconnections is shown.

FIG. 4 shows a layout of a 15-level implementation where the connections are suitably localized between levels.

FIG. 5 shows an embodiment where interconnections of outputs going to levels forward are mingled with outputs going backward.

DETAILED DESCRIPTION OF THE INVENTION

This invention relates to programmable integrated circuits, where a given device can be customized to perform a desired logic function, including or excluding memory.

Listed below are definitions of various terms used to describe the structure and the function of the present invention. These definitions apply to the terms as they are used throughout the specification (unless the are otherwise limited in specific instances either individually or as a part of a larger group).

The term "logic-level representations" refers to any logic level-representation in electronic design method that capable of being implemented by a plurality of programmable logic functions.

The term "programmable logic function" refers to any configurable logic element that my include all of the circuit elements necessary to provide one or more of the logical functions provided by, for example, an AND gate, flip-flop, inverter, NOR gate exclusive OR gate, and combinations of these functions to form more complex functions.

The term "interconnect" refers to any interconnect that connects logic-level representations within a programmable integrated circuit and to any wire that connects configurable logic elements among each other within any logic level representation.

The term "adjacent" refers to any two logic-level representations that located next to each other in the programmable integrated circuit structure.

The term "switch matrix" refers to any sets of input lines and any set of output lines wherein any one set of input lines connected to any one corresponding set of output lines.

The term "substantially identical 2-dimensional array" refers to memory arrays that maintained an aspect ration close to square.

The term "memory representations" refers to any memory array comprises a plurality of logic-level representations.

The term "memory block" refers to any memory block comprises two or more configurable logic elements.

Figure 1:
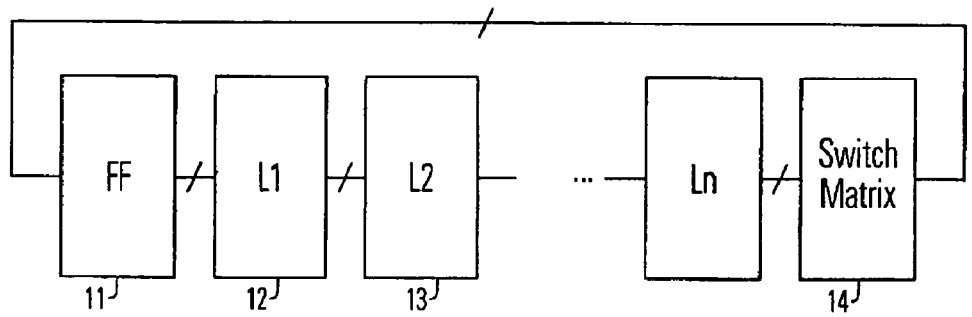
FIG. 1 is a diagram of the programmable integrated architecture where interconnections are restricted to those between adjacent levels, where the zeroth level consists of a bank of memory elements and successive levels consist of a bank of configurable logic elements.

FIG. 1 shows the generic structure of the programmable integrated circuit architecture. In the present invention a programmable integrated circuit structure comprising a plurality of logic-level representations FF through Ln, wherein each-logic level representation comprises a plurality of programmable logic functions. The structure also comprises a first interconnect representation between adjacent logic-level representations such as FF and L1, wherein the first interconnect representation couples an output (11) of a programmable logic function in a first logic-level representation FF to an input (12) of a corresponding programmable logic function in a second logic-level representation L1 that is adjacent to the first logic level representation FF.

The first interconnect representation between adjacent levels is substantially localized. This interconnect representation comprises a non-programmable interconnect representation or fixed representation. A bank of flip-flops (13) feeds the first logic-level representation FF. There is a switch matrix (14) inserted between a carefully chosen pairs of logic-levels representations.

Figure 2:
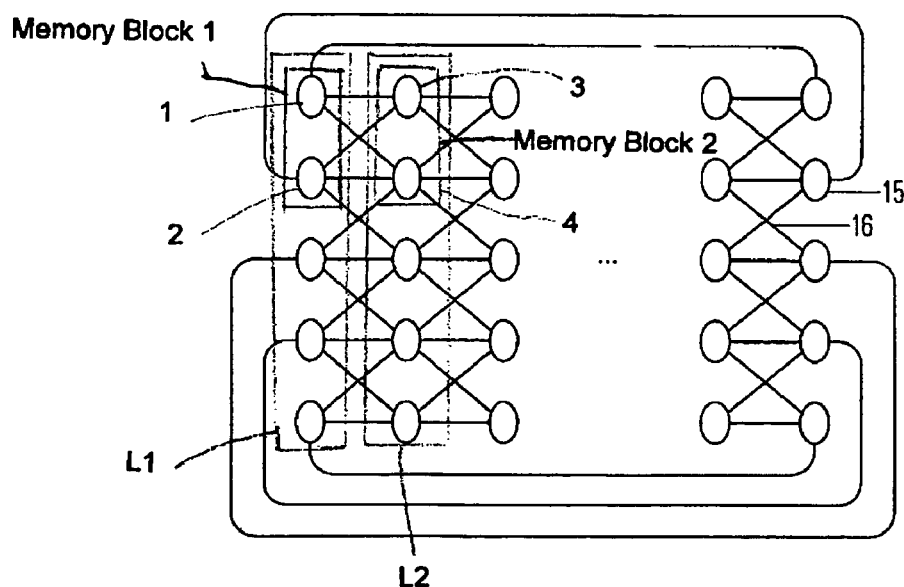
FIG. 2 shows the connection diagram between levels, where a column of programmable logic functions represents each level.

Each logic-level representation consists of a bank of programmable logic functions, where a programmable logic function (15) is shown in FIG. 2. To describe how programmable logic functions are interconnected with each other within a given logic-level representation and how programmable logic functions of one logic-level representation are interconnected with other programmable logic functions from other logic level representations, each logic-level representation is divided into a number of memory blocks in such way that a first memory block comprises an output (1) of the first programmable logic function of a first logic-level representation and an output (2) the second programmable logic function of the first logic level representation, and a second memory block comprises an output (3) of the third programmable logic function of a second logic-level representation and an output (4) of the fourth programmable logic function of the second logic level representation; wherein within the first memory block the output (1) of the first programmable logic function of the first logic-level representation corresponds to the output (2) of the second programmable logic function of the first logic-level representation, and within the second memory block the output (3) of the third programmable logic function of the second logic-level representation corresponds to the output (4) of the fourth programmable logic function of the second logic-level representation. The output (1) of the first programmable logic function of the first logic-level representation of the first memory block is coupled to the output (3) of the third programmable logic function and to the output (4) of the fourth programmable logic function of the second logic-level representation of the second memory block, and the output (1) of the first programmable logic function of the first logic-level representation is uncoupled to the output (2) of the second programmable logic function of the first logic-level representation within the first memory block. Thus, there is no interconnect representation among programmable logic functions within the first logic-level representation, wherein in traditional programmable integrated circuit architecture the output (1) of the first programmable logic function of the first logic-level representation is coupled to the output (2) of the second programmable logic function of the first logic-level representation within the first memory block.

The output (3) of the third programmable logic function of the second logic-level representation of the second memory block is coupled to the output (1) of the first programmable logic function and to the output (2) of the second programmable logic function of the first logic-level representation of the first memory block, and the output (3) of the third programmable logic function of the second logic-level representation is uncoupled to the output (4) of the fourth programmable logic function of the second logic-level representation within the second memory block. Thus, there is no interconnect representation among programmable logic functions within the second logic-level representation, wherein in traditional programmable integrated circuit architecture the output (3) of the third programmable logic function of the second logic-level representation is coupled to the output (4) of the fourth programmable logic function of the second logic-level representation within the second memory block.

The interconnections for a programmable logic function are fixed and local, such as the wire in (16). Thus, the programmable integrated circuit achieves, dense short wiring without the need for programmable interconnect.

FIG. 3 shows an embodiment of the chip layout, showing the connections between the output of one level (17) to the next level (18). The layout of the configurable logic elements, such as (19) and the connections, such as (20), are shown. All routing is achieved over the cells, without any need for routing matrices, leading to denser implementation. The figure is merely representative, and an embodiment may have several thousands of configurable logic elements in a level.

FIG. 4 shows how a 15-level implementation of the architecture can be realized, while maintaining an aspect ratio that is close to square. Thus, in the presently claimed invention a plurality of the logic-level representations is implemented as substantially identical 2-dimensional arrays. The figure is merely representative, and an embodiment may have a plurality of the logic-level representative that is implemented as memory arrays that are different in sizes.

In FIG. 5, an embodiment where interconnects from different levels are mingled. The wires from the output of one level are interleaved with outputs from a separate level, which enables the wires of one level to act as virtual shields, avoiding crosstalk between wires of the same level, which switch at the same time.

A joint patent application describes how to map an arbitrary design onto this architecture. The description in FIG. 3 is only representative—the actual embodiment could have a 100×100 array, for instance, so each logic level has 10,000 combinational logic elements. With 15 such levels, the chip might contain 150,000 configurable logic elements.

Any path from the output of a memory element to its input goes through the same number of levels and every path is therefore critical. Traditional methods leave some paths non-critical and other paths critical, which can directly be exploited by a custom implementation to speed up critical paths at the expense of non-critical ones—such bottlenecks are inherently avoided by the current architecture. Also, the absence of switches to program the interconnect means that the circuit not only operates faster, but is also more dense. There is less stray wiring than conventional programmable circuits, so the power dissipation at similar operation speed is lower. Also, there is a clear demarcation between elements, which are purely sequential (memory elements) and logic elements, which are purely combinational (no memory), leading to better layout density than architectures where each element has a mix of these elements, leading to poor utilization in conventional architectures.

What is claimed is:

1. A programmable integrated circuit (IC) comprising:
   a plurality of logic-level representations, wherein each logic-level representation comprises a plurality of programmable logic functions;
   a first interconnect representation between adjacent logic-level representations;
   a second interconnect representation coupled between a switch matrix and a third logic-level representation; and
   a third interconnect representation coupled between the switch matrix and a fourth logic-level representation;
      wherein the first interconnect representation couples to an output of a programmable logic function in a first logic-level representation to an input of a corresponding programmable logic function in the second logic-level representation that is adjacent to the first logic-level representation; and
      wherein the third logic-level representation and the fourth logic-level representation are not adjacent.

2. A programmable integrated circuit (IC) comprising:
   a plurality of logic-level representations, wherein each logic-level representation comprises a plurality of programmable logic functions;
   a first interconnect representation between adjacent logic-level representations;
      wherein the first interconnect representation couples an output of a programmable logic function in a first logic-level representation to an input of a corresponding programmable logic function in a second logic-level representation that is adjacent to the first logic-level representation;

a first memory block comprising an output of the first programmable logic function of the first logic-level representation and an output the second programmable logic function of the first logic-level representation; and a second memory block comprising an output of the third programmable logic function of a second logic-level representation and an output of the fourth programmable logic function of the second logic level representation;

wherein within the first memory block the output of the first programmable logic function of the first logic-level representation corresponds to the output of the second programmable logic function of the first logic-level representation, and within the second memory block the output of the third programmable logic function of the second logic-level representation corresponds to the output of the fourth programmable logic function of the second logic-level representation;

wherein the output of the first programmable logic function of the first logic-level representation of the first memory block is coupled to the output of the third programmable logic function and the output of the fourth programmable logic function of the second logic-level representation of the second memory block, and the output of the first programmable logic function of the first logic-level representation is uncoupled to the output of the second programmable logic function of the first logic-level representation within the first memory block; and wherein the output of the third programmable logic function of the second logic-level representation of the second memory block is coupled to the output of the first programmable logic function and to the output of the second programmable logic function of the first logic-level representation of the first memory block, and the output of the third programmable logic function of the second logic-level representation is uncoupled to the output of the fourth programmable logic function of the second logic-level representation within the second memory block.

3. A programmable integrated circuit (IC), comprising:

a plurality of logic-level representations, wherein each logic-level representation comprises a plurality of programmable logic functions;

a first interconnect representation between adjacent logic-level representations;

wherein the first interconnect representation couples an output of a programmable logic function in a first logic-level representation to an input of a corresponding programmable logic function in a second logic-level representation that is adjacent to the first logic-level representation;

a third logic-level representation comprises of programmable logic functions; and an interconnect representation between the first logic-level representation and the third logic-level representation;

wherein the interconnect representation couples an output of a programmable logic function in the first logic-level representation to an input of a corresponding programmable logic function in a third logic-level representation;

wherein there is no interconnect representation couples an output of a programmable logic function in the first logic-level to an input of corresponding programmable logic function in a fourth logic-level representation; and wherein there is no interconnect representation couples an output of programmable logic function in the second logic-level representation to an input of a corresponding programmable logic function in the third logic-level representation.

4. An electronic design method comprising the steps of:

generating a plurality of logic-level representations;
wherein each logic-level representation comprises a plurality of programmable logic functions;

generating a first interconnect representation between adjacent logic-level representations;
wherein the first interconnect representation couples an output of a programmable logic function in a first logic-level representation to an input of a corresponding programmable logic function in a second logic-level representation that is adjacent to the first logic level representation;

generating a second interconnect representation coupled between a switch matrix and a third logic-level representation; and generating a third interconnect representation coupled between the switch matrix and a fourth logic-level representation;
wherein the third logic-level representation and the fourth logic-level representation are not adjacent.

5. An electronic design method comprising the steps of:

generating a plurality of logic-level representations,
wherein each logic-level representation comprises a plurality of programmable logic functions;

generating a first interconnect representation between adjacent logic-level representations;
wherein the first interconnect representation couples an output of a programmable logic function in a first logic-level representation to an input of a corresponding programmable logic function in a second logic-level representation that is adjacent to the first logic level representation;

generating a first memory block comprises an output of the first programmable logic function of a first logic-level representation and an output the second programmable logic function of the first logic level representation; and generating a second memory block comprises an output of the third programmable logic function of a second logic-level representation and an output of the fourth programmable logic function of the second logic level representation;

wherein within the first memory block the output of the first programmable logic function of the first logic-level representation corresponds to the output of the second programmable logic function of the first logic-level representation, and within the second memory block the output of the third programmable logic function of the second logic-level representation corresponds to the output of the fourth programmable logic function of the second logic-level representation;

wherein the output of the first programmable logic function of the first logic-level representation of the first memory block is coupled to the output of the third programmable logic function and to the output of the fourth programmable logic function of the second logic-level representation of the second memory block, and the output of the first programmable logic function of the first logic-level representation is uncoupled to the output of the second programmable logic function of the first logic-level representation within the first memory block; and wherein the output of the third programmable logic function of the second logic-level representation of the second memory block is coupled to the output of the first programmable logic function and to the output of the second programmable logic function of the first logic-level representation of the first memory block, and the output of the third programmable logic function of the second logic-level representation is uncoupled to the output of the fourth programmable logic function of the second logic-level representation within the second memory block.

6. An electronic design method comprising the steps of:

generating a plurality of logic-level representations, wherein each logic-level representation comprises a plurality of programmable logic functions;

generating a first interconnect representation between adjacent logic-level representations;
   wherein the first interconnect representation couples an output of a programmable logic function in a first logic-level representation to an input of a corresponding programmable logic function in a second logic-level representation that is adjacent to the first logic-level representation;

generating a third interconnect representation comprises of programmable logic functions; and generating an interconnect representation between the first logic-level representation and the third logic-level representation;
   wherein the interconnect representation couples an output of a programmable logic function in a first logic-level representation to an input of a corresponding programmable logic function in a third logic-level representation;
   wherein there is no interconnect representation couples an output of a programmable logic function in the first logic-level to an input of corresponding programmable logic function in a second logic-level representation; and
   wherein there is no interconnect representation couples an output of a programmable logic function in the second logic-level representation to an input of a corresponding programmable logic function in the third logic-level representation.

* * * * *